(12) United States Patent
Luna et al.

(10) Patent No.: US 7,142,603 B2
(45) Date of Patent: Nov. 28, 2006

(54) METHOD AND SYSTEM FOR PREDICTIVE TABLE LOOK-UP CODE LENGTH OF VARIABLE LENGTH CODE

(75) Inventors: Amelia C. Luna, San Jose, CA (US); Jason (Naxin) Wang, San Jose, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 1110 days.

(21) Appl. No.: 09/933,599

(22) Filed: Aug. 20, 2001

(65) Prior Publication Data

US 2004/0218679 A1 Nov. 4, 2004

Related U.S. Application Data

(63) Continuation of application No. 09/602,578, filed on Jun. 22, 2000, now abandoned.

(60) Provisional application No. 60/176,256, filed on Jan. 15, 2000.

(51) Int. Cl.
*H04N 7/12* (2006.01)

(52) U.S. Cl. .................................................. 375/240.23

(58) Field of Classification Search ........... 375/240.01, 375/240.23, 240.26; 341/59, 60, 61, 63, 341/65, 67; *H04N 7/12*
See application file for complete search history.

(56) References Cited

U.S. PATENT DOCUMENTS

| 5,396,595 A | 3/1995 | Standley ..................... 395/250 |
| 5,537,551 A | 7/1996 | Denenberg et al. .... 395/200.18 |
| 5,852,469 A | 12/1998 | Nagai et al. ................. 348/384 |
| 5,883,589 A | 3/1999 | Takishima et al. ............ 341/67 |
| 6,211,801 B1 | 4/2001 | Girod .......................... 341/67 |
| 6,256,064 B1 | 7/2001 | Chujoh et al. ......... 348/240.23 |

*Primary Examiner*—Young Lee

(57) ABSTRACT

A method and system for decoding symbols of variable length in a digital video bit stream in real time, using Very Long Instruction Word (VLIW) architecture. In one embodiment, several bit sections are first read from a bit stream. While the first bit section will correspond to a valid symbol in the bit-stream, the rest of the bit sections may or may not, depending on the length of the first section. A table of variable length codes is then indexed to obtain a look-up result for each of the read-in bit sections, which done in parallel for all sections. Next, a determination is made as to whether each of the look-up results is valid. A valid look-up result provides the length of the symbol. The valid look-up values are then accepted. In another embodiment the bit stream is thereafter advanced by the sum of all accepted look-up results.

16 Claims, 10 Drawing Sheets

| CODE | LENGTH | VALUE |
|---|---|---|
| 0 0 0 | 3 | 0, 1 |
| 0 1 0 0 | 4 | 0, 2 |
| 0 1 1 0 | 4 | - |
| 0 1 1 1 0 | 5 | 1, 1 |
| 1 0 0 0 0 | 5 | 0, 3 |
| 1 0 0 1 0 | 5 | 0, 4 |
| 1 0 1 0 0 0 | 6 | 2, 1 |
| 1 0 1 0 1 0 | 6 | 1, 2 |
| 1 0 1 1 0 0 | 6 | 0, 5 |
| 1 0 1 1 1 0 | 6 | 0, 6 |

680 → 0 0 0 0 1 1 1 0 0 1 0 0 1 0 1 0 1 0 0 1 1 1 0 0 1 0 0 0 0 0 1 0 0 0 0

| CODE | LENGTH | VALUE |
|---|---|---|
| 0 0 0 | 3 | 0, 1 |
| 0 1 0 0 | 4 | 0, 2 |
| 0 1 1 0 | 4 | - |
| 0 1 1 1 0 | 5 | 1, 1 |
| 1 0 0 0 0 | 5 | 0, 3 |
| 1 0 0 1 0 | 5 | 0, 4 |
| 1 0 1 0 0 0 | 6 | 2, 1 |
| 1 0 1 0 1 0 | 6 | 1, 2 |
| 1 0 1 1 0 0 | 6 | 0, 5 |
| 1 0 1 1 1 0 | 6 | 0, 6 |

METHOD AND SYSTEM FOR PREDICTIVE TABLE LOOK-UP CODE LENGTH OF VARIABLE LENGTH CODE

RELATED U.S. APPLICATION

This is a continuation of application Ser. No. 09/602,578 filed on Jun. 22, 2000 now abandoned which is hereby incorporated by reference to this specification.

This Application is related to U.S. Provisional Application entitled, "Pre-parsing of Variable Length Digital Video (DV) Streams," application Ser. No. 60/176,256, filed on Jan. 15, 2000. Said provisional application is hereby incorporated by reference.

FIELD OF THE INVENTION

The present invention relates to the field of digital signal processing. Specifically, the present invention relates to a system and method for efficiently decoding a video signal encoded with a variable length code.

BACKGROUND ART

The field of digital video signal processing has seen rapid development in recent years. Operations, such as decoding and decompressing a signal, which were once done in hardware are now becoming possible to implement in software. However, problems still exist performing digital signal processing via software.

One standard for video signal processing is described in a specification entitled, "The Specification of Consumer Use Digital Video VCR's using 6.3 mm Magnetic Tape" (HD Digital VCR Conference, December, 1994). As described therein, video signals are sampled at 13.5 MHz for luminance and 6.75 MHz for color differences and compressed before storing on a magnetic tape. The compression is done with a bit rate reduction technique using Discrete Cosine Transform (DCT) and Variable Length Coding (VLC), e.g., Huffman coding. The compressed data of one video segment is assigned to 30 separate blocks. The variable length coding process leaves the data in each block as a contiguous stream of variable length codes. In this application, the variable length codes may also be known as symbols. Because the symbols are variable length and also stored contiguously, it is impossible to know in advance where the beginning of each symbol is within a block (other than the first symbol).

The process of decoding and decompressing the stored signal involves a reverse of the process of storing it. That is, first the signal must be decoded before an Inverse Discrete Cosine Transform is performed. Other steps, such as Inverse Quantization, may be performed as well, if quantization was done prior to storage. As described above, it is difficult to decode the symbols because they are of variable length and are not assigned pre-defined locations within each block. That is, the length of the first symbol must be known so that a variable length shift can be done to obtain the start of the next symbol. Furthermore, decoding the video signal must be done in real time for practical use. Unfortunately, this can be difficult even with a relatively fast processor.

Some conventional techniques decode one symbol at a time, obtaining the length of the first symbol to gain the offset into the bit-stream needed to locate the start of the second variable length symbol. These techniques may not be fast enough to achieve real time video processing. Exacerbating the problem is the fact that the architecture used may have a relatively long latency for memory access. Given that the conventional technique must first decode a symbol before knowing the location of the next symbol, the second memory read is delayed until the first symbol is decoded. Consequently, the processor may sit idle while data is being accessed and real time signal processing may not be achieved. Another problem caused by the variable length coding is that while some computer architectures feature multiple ALUs, most of the ALUs sit idle while a symbol is being decoded to get the starting location of the next symbol.

SUMMARY OF THE INVENTION

Therefore, it would be advantageous, then, to provide a method and system for an efficient software based variable length decoder, which processes a digital video signal comprising variable length codes (symbols). What is further needed is a method and system which allows more than one symbol to be decoded per iteration of a software loop. A still further need exists for a method and system which operates efficiently when using an architecture with a relatively long latency memory access and with multiple ALUs. An even further need exists for such a method and system which can process an encoded digital video signal in real time.

The present invention provides a method and system for decoding symbols of variable length in a digital video bit stream, using Very Long Instruction Word (VLIW) architecture. The invention takes advantage of the parallelism of the VLIW architecture to provide a software solution which decodes more than one symbol per iteration of a software loop. Furthermore, the present invention operates efficiently with instruction sets which have relatively long latency memory accesses and have multiple ALUs. A still further advantage of the present invention is its ability to decode compressed digital video signal in real time. The present invention provides these advantages and others not specifically mentioned above but described in the sections to follow.

A method and system for decoding symbols of variable length in a digital video bit stream in real time, using Very Long Instruction Word (VLIW) architecture is disclosed. One embodiment of the present invention first reads several bit sections from a bit stream. The bit stream comprises digital video information and is made up of a series of encoded symbols of varying length. While the first bit section will correspond to a valid symbol in the bit-stream, the rest of the bit sections may or may not, depending on the length of the first section. The next step of this embodiment is indexing a table of variable length codes to obtain a look-up result for each of the read-in bit sections. This is done in parallel for all sections. Next, this embodiment of the present invention determines whether each of the look-up results is valid. A valid look-up result provides the length of the symbol. Next, the valid look-up values are accepted. In another embodiment of the present invention, an additional step is performed of advancing the bit stream by the sum of all accepted look-up results and reading more bit sections. In this fashion, multiple symbols from the bit stream may be read and processed in parallel, even though the length of the symbols is unknown when first reading them.

Another embodiment of the present invention processes a block of digital video signal information using single instruction multiple data (SIMD) instruction set. This embodiment decodes, in parallel, a number of blocks within a video segment using a single SIMD instruction. By utilizing parallel hardware resources, one software loop can decode multiple blocks of a bit stream at the same time because the starting point of each block is known in advance.

Yet another embodiment of the present invention takes advantage of the multiple ALUs in VLIW architecture by running a set of SIMD instructions on each ALU. In this fashion, all the blocks in an entire video segment may be decoded in parallel, with each block within the video segment being decoded sequentially.

BRIEF DESCRIPTION OF THE DRAWINGS

FIG. 4A is an exemplary table of codewords of variable length coding, which an embodiment of the present invention may use to decode compressed video signals.

DETAILED DESCRIPTION OF THE INVENTION

Figure 1:
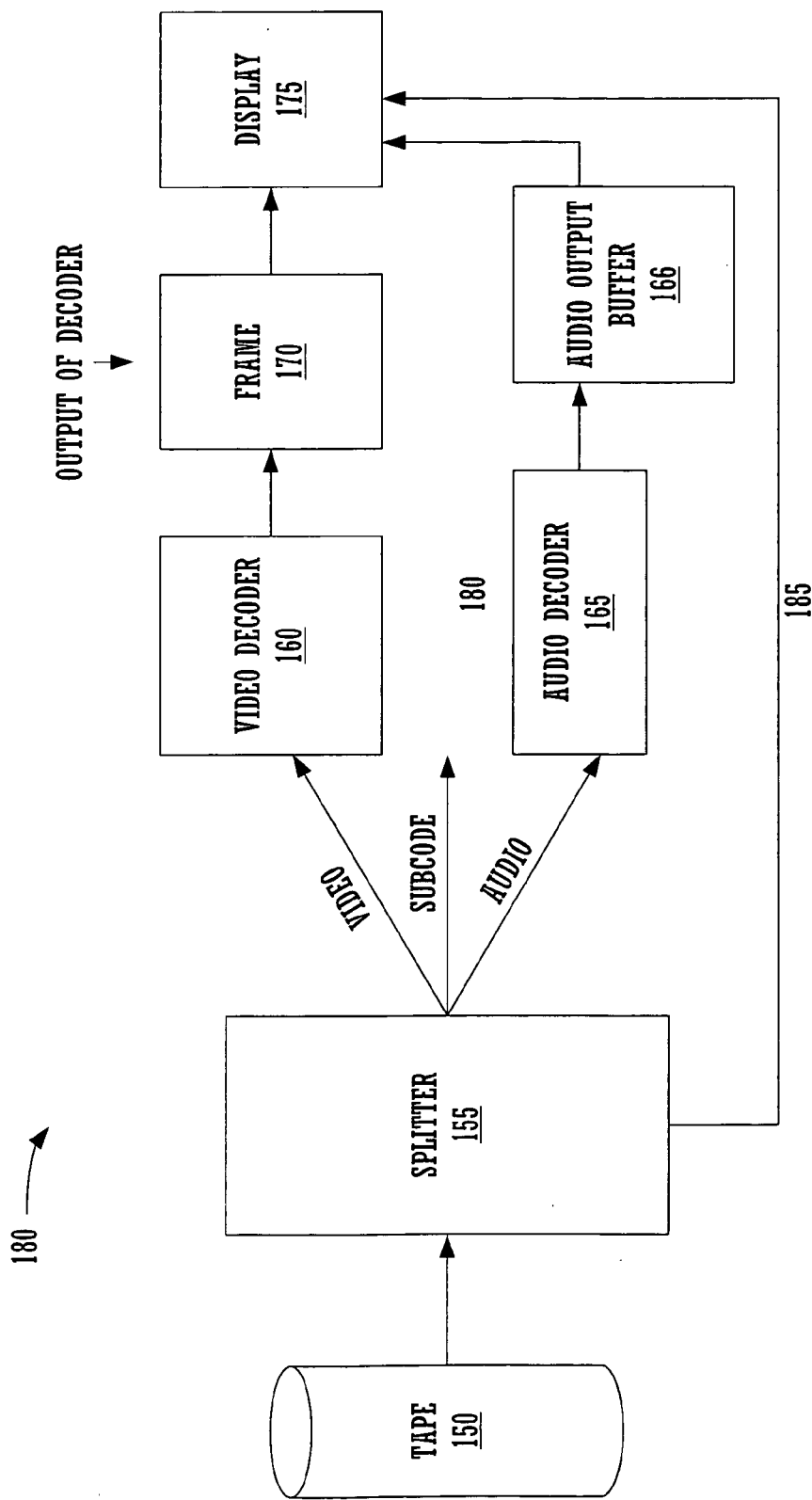
FIG. 1 is an illustration of a DV (digital video) system, which an embodiment of the present invention may be practiced within.

In the following detailed description of the present invention, a method and system for decoding, in parallel, symbols of variable length in a digital video bit stream in real time, using Very Long Instruction Word (VLIW) architecture, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

METHOD AND SYSTEM FOR PREDICTIVE TABLE LOOK-UP OF CODE LENGTH OF VARIABLE LENGTH CODE

The present invention provides for a method and system for decoding symbols of variable length in a digital video bit stream in real time, using Very Long Instruction Word (VLIW) architecture. One embodiment of the present invention uses predictive table look-up to enable the invention to process more than one variable length code (symbol) per software iteration, e.g., in parallel. Another embodiment takes advantage of Single Instruction Multiple Data (SIMD) instruction set to decode symbols in a number of different blocks in a video segment, in parallel. Consequently, a compressed digital signal may be processed in real time. While embodiments of the present invention describe decoding a digital video signal, the present invention is well-suited to operating on other signals as well, such as audio.

FIG. 1 illustrates an exemplary DV (Digital Video) system 180 of which the present invention forms a part. A compressed digitized video signal, along with an audio signal and a subcode, is stored on a storage medium, e.g., a tape 150. Those combined signals are sent to a splitter 155, which outputs the video component to a video decoder 160. The audio component goes to an audio decoder 165 and then to an audio output buffer 166. The present invention may be practiced within the video decoder 160, which outputs a frame 170 of uncompressed video information. The frame 170 is displayed on the display 175, along with the corresponding audio signal. A control line 185 from the splitter 155 to the display 175 may be used to help synchronize the process.

Figure 2:
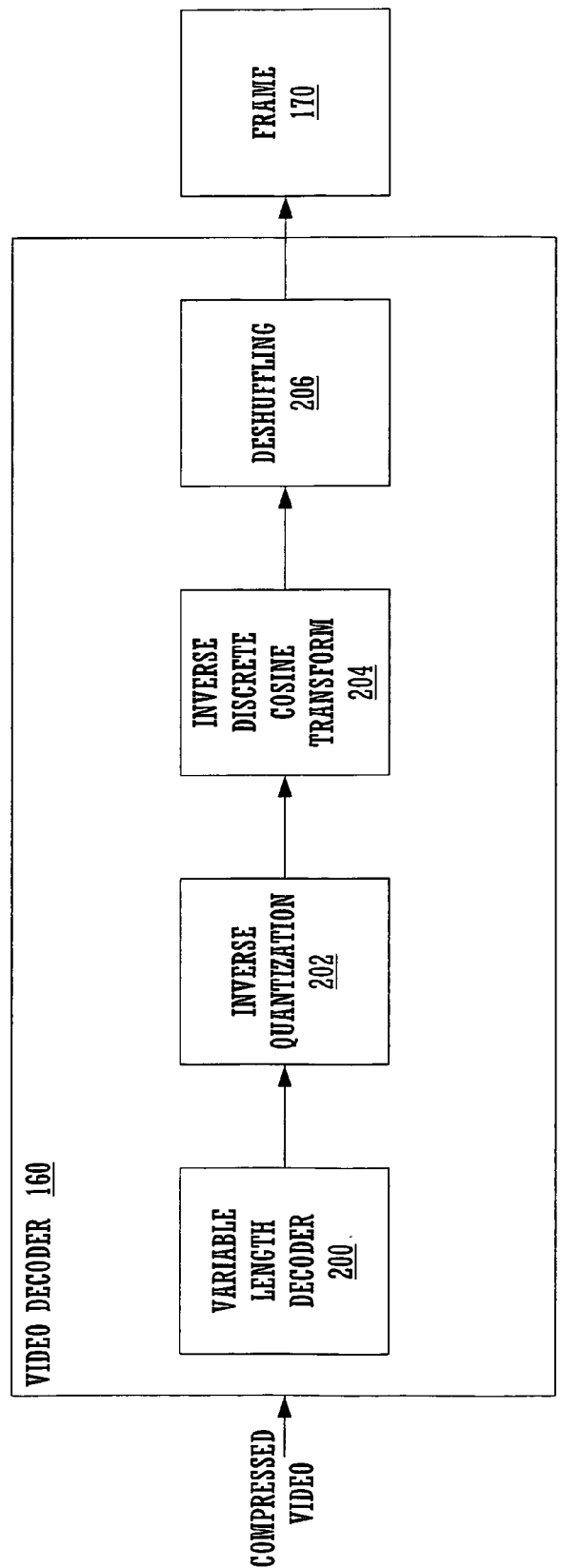
FIG. 2 is an illustration of components of the video decoder of FIG. 1, which an embodiment of the present invention may be practiced within.

FIG. 2 illustrates a schematic of the exemplary video decoder 160 that can be used in accordance with the present invention. A compressed and coded signal is input to the video decoder 160. The signal may be in a format described in the standard entitled, "The Specification of Consumer Use Digital Video VCRs using 6.3 mm Magnetic Tape," (HD Digital VCR Conference, December, 1994). However, the present invention is well-suited to other formats as well. The first stage is a variable length decoder (VLD) 200, in which the present invention may be practiced. When using the above-stated format, the input to the VLD 200 is a bit stream of compressed and coded video data, which is logically organized in blocks. It is appreciated that stage 200 can be implemented in software executing on a computer. The VLD 200 outputs an 8×8 Byte block of decoded but still compressed video digital data to the Inverse Quantization Stage (IQ) stage 202.

The IQ stage 202 performs the reverse of the quantization process done before the signal was stored. The next stage is an Inverse Discrete Cosine Transform (IDCT) 204, which reverses the Discrete Cosine Transform done before storing the signal. Finally, the signal is de-shuffled at de-shuffler stage 206 to produce a replication of the original frame 170 of video content. The IQ, IDCT, and de-shuffling steps described and the associated components (202, 204, 206) in the video decoder 170 are only exemplary, as the present invention is well-suited to function in other systems with alternate ways of compressing signals.

Figure 3:
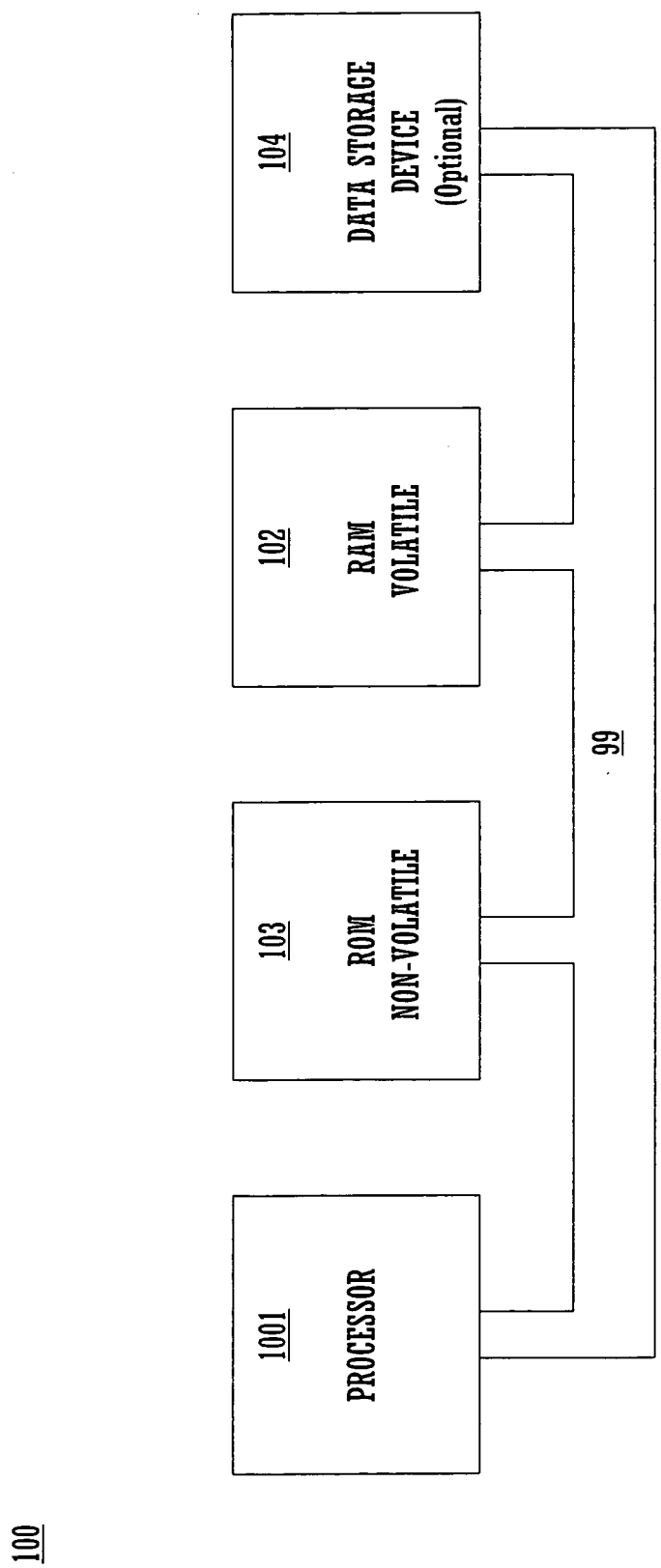
FIG. 3 is a schematic of a computer system, which may be useful to implement an embodiment of the present invention.

FIG. 3 illustrates circuitry of computer system 100, which may form a platform for a portion of the VLD 200. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 coupled with the bus 99 for storing information and instructions.

FIG. 4A illustrates an exemplary table of variable length codes 302, which may be stored in memory 102. As is clear from the exemplary Huffman-type table, each code (symbol) in the table has a specific length, as well as a value. The value may consist of a run and an amplitude, although the nature of this information is not critical to the present invention. The codes themselves, their lengths, and values are pre-established. Relatively common values from the original data may be encoded with short codes, thus giving greater compression. One example that the present invention is well-suited to function with is Huffman coding, which uses codes, in this example, from 3 to 16 bits long. However, the present invention is well-suited to operate with any variable length code system, and with codes of any minimum or maximum length. Table 302 is exemplary for illustrative purposes; the table which the present invention operates with will generally contain more values than is shown in FIG. 4A.

Figure 4B:
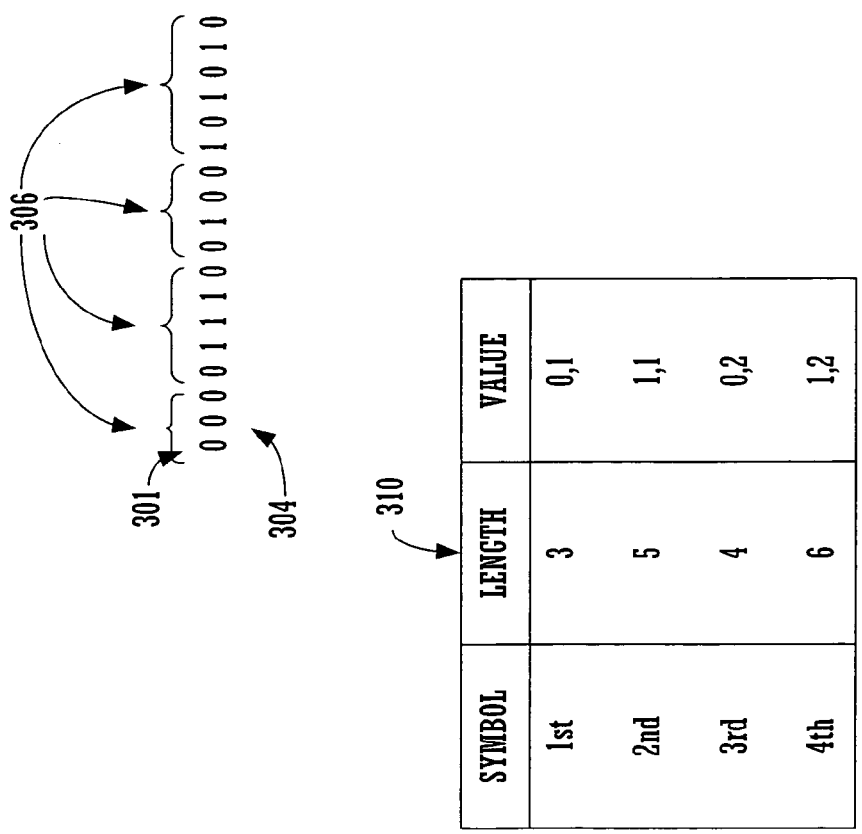
FIG. 4B is an exemplary table of the length and value of the symbols in an exemplary bit-stream, which an embodiment of the present invention may decode.

FIG. 4B illustrates an exemplary bit stream 304, which has a reference bit 301 at left edge. The exemplary bit stream comprises four symbols 306 of varying length. Each of those symbols may be used to index the table 302 (FIG. 4A) to obtain a length and a value for that symbol. For example, the four symbols 306 (000), (01110), (0100), and (101010) can be used to index the table 302 to obtain the length and the value for each symbol shown in table 310 (FIG. 4B). As mention herein, this process can be problematic because the length of the first symbol must be determined to know where the second symbol starts. An embodiment of the present invention provides for a method of predictive table look-up of a second symbol in the bit stream before it is known where the second symbol starts in the bit stream. In a similar fashion, other embodiments of the present invention may predictively look-up a third symbol, or more symbols before their locations in the bit-stream are determined.

Figure 5:
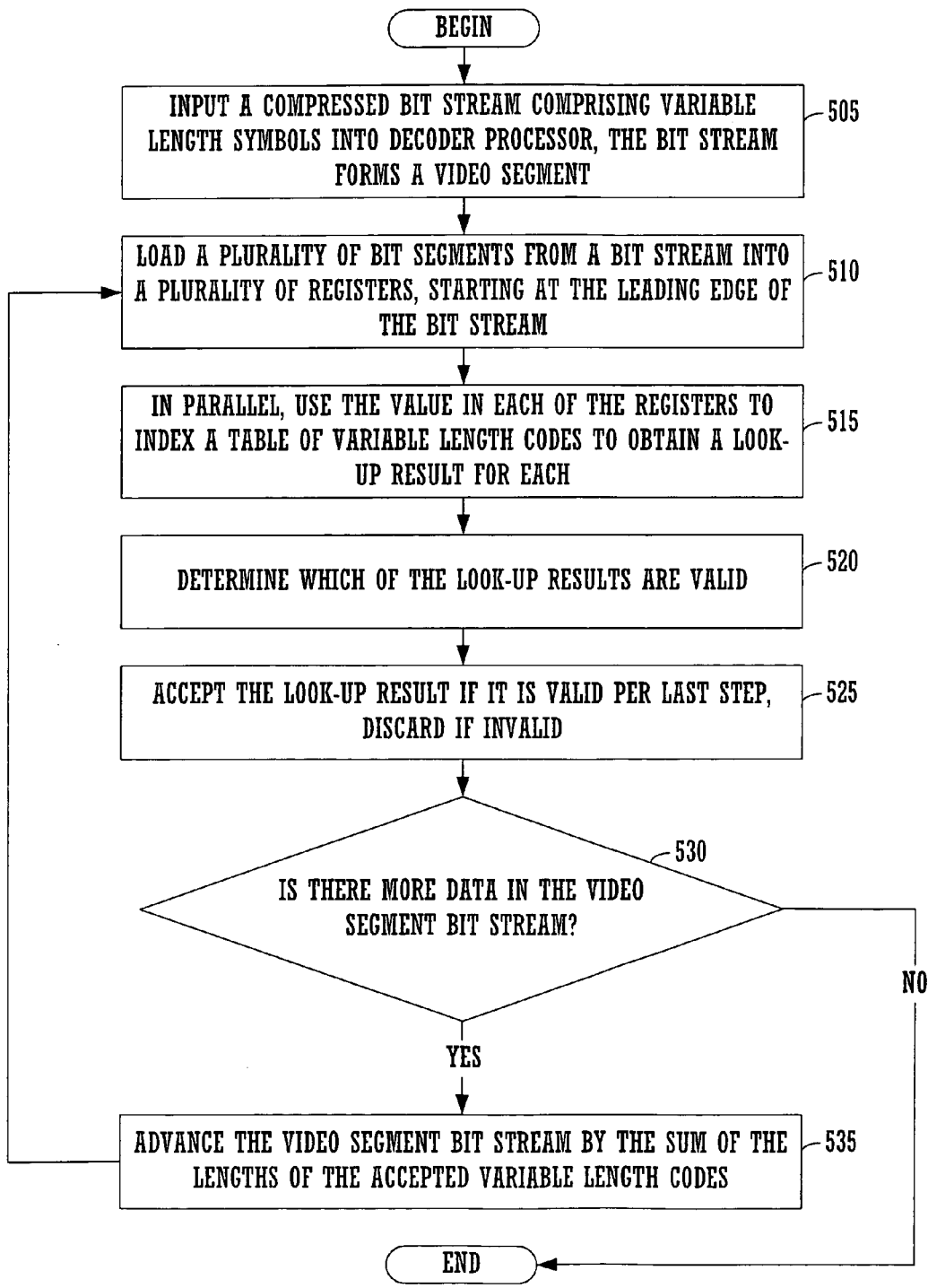
FIG. 5 is a flowchart illustrating the steps of predictive table look-up of variable length codes, according to an embodiment of the present invention.

FIG. 5 illustrates a flowchart 500 describing the steps of an embodiment of the present invention that uses predictive table look-up to perform variable length decoding. This embodiment takes advantage of the parallelism of VLIW architecture to perform multiple table look-ups in parallel in one software loop. In step 505, a compressed and encoded bit stream comprising variable length codes (symbols) is input into the VLD 200. The bit stream is logically divided into video segments, which in turn are subdivided into macro-blocks, as is well known in the art. In step 510, a plurality of bit sections are loaded into a plurality of registers, starting with a reference bit 301 of the bit stream. For example, the reference bit 301 may be the leading edge of the bitstream. The bit sections may be of any convenient size. For example, when using 16-bit Huffman encoding, the sections may be 16-bits long. The sections will always be at least as long as the minimum length of code. Clearly, bit sections will often be longer than a single symbol. Because the location of the beginning of the bit stream is known, the first section will always include a valid symbol. However, as the symbol lengths in the bit-stream are variable and cannot be known in advance, some of the rest of the bit sections will correspond to valid symbols, while others will not.

In step 515 or FIG. 5 the values in the registers are used to index the table of variable length codes 302 to obtain a look-up result, which is the length of the code. Invalid bit sections have a pre-determined length. Taking advantage of the parallelism of VLIW architecture, a number of look-ups are done in parallel. While VLIW architecture is provided as an example, the present invention is well-suited to operating with any architecture which allows multiple operations to be performed in parallel. In step 520, an embodiment of the present invention determines whether each of the look-up results is valid. A more detailed example is given below, and illustrated in FIGS. 6A–6B, describing one embodiment of this determination. In step 525, the valid look-up results are accepted and the rest are discarded.

In step 530, the present invention determines whether more data is in the bit stream. If so, the bit stream is advanced by the appropriate length, based on the valid results. For example, the bit-stream may be advanced by the sum of the lengths of the accepted code lengths. In this fashion a new reference bit 301 for the bit stream is determined, and the process is repeated from step 510.

Figure 6A:
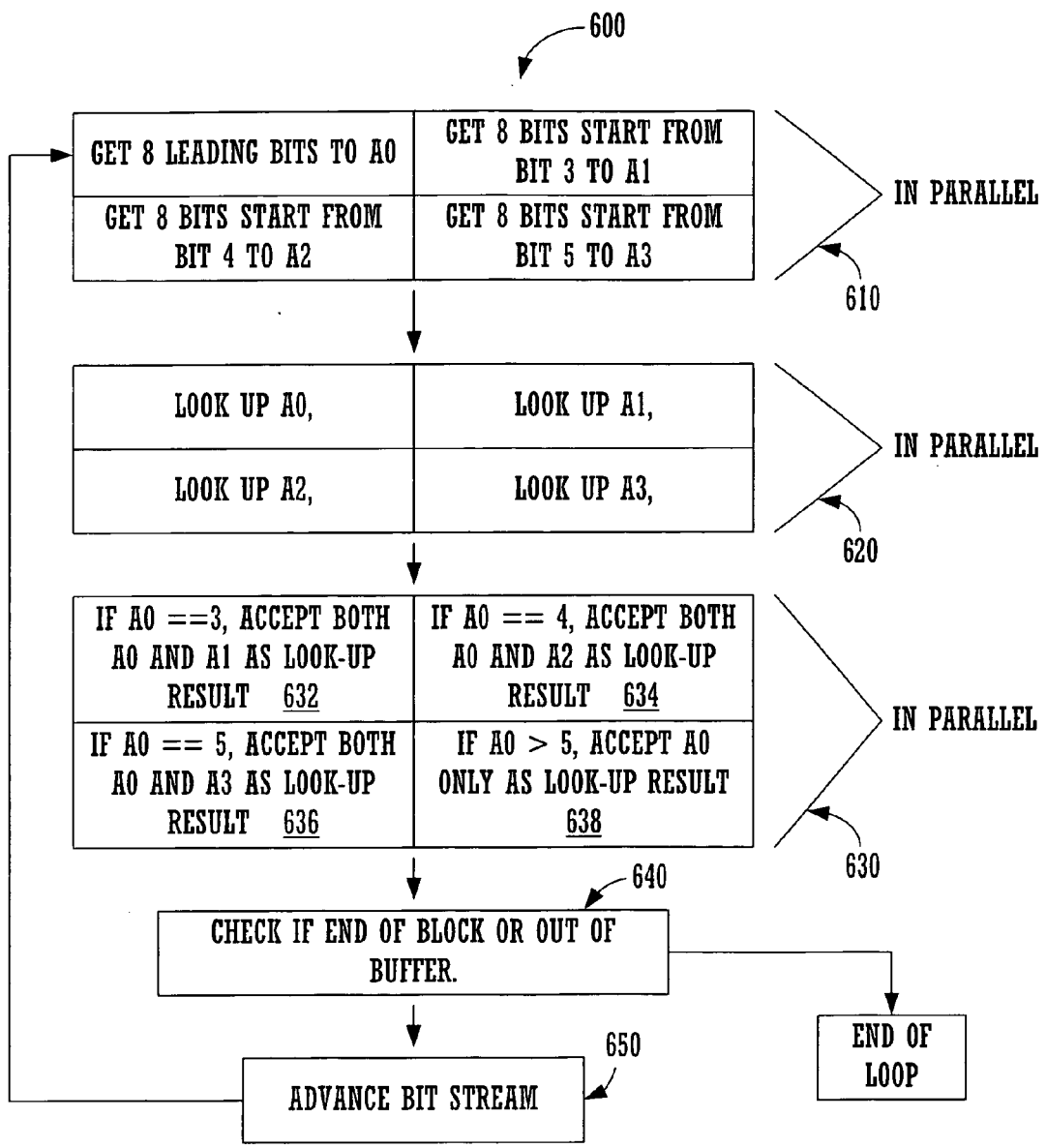
FIG. 6A is a flowchart of the steps of predictive table look-up, according to an embodiment of the present invention which loads four 8-bit samples from the bit stream in parallel.
Figure 6B:
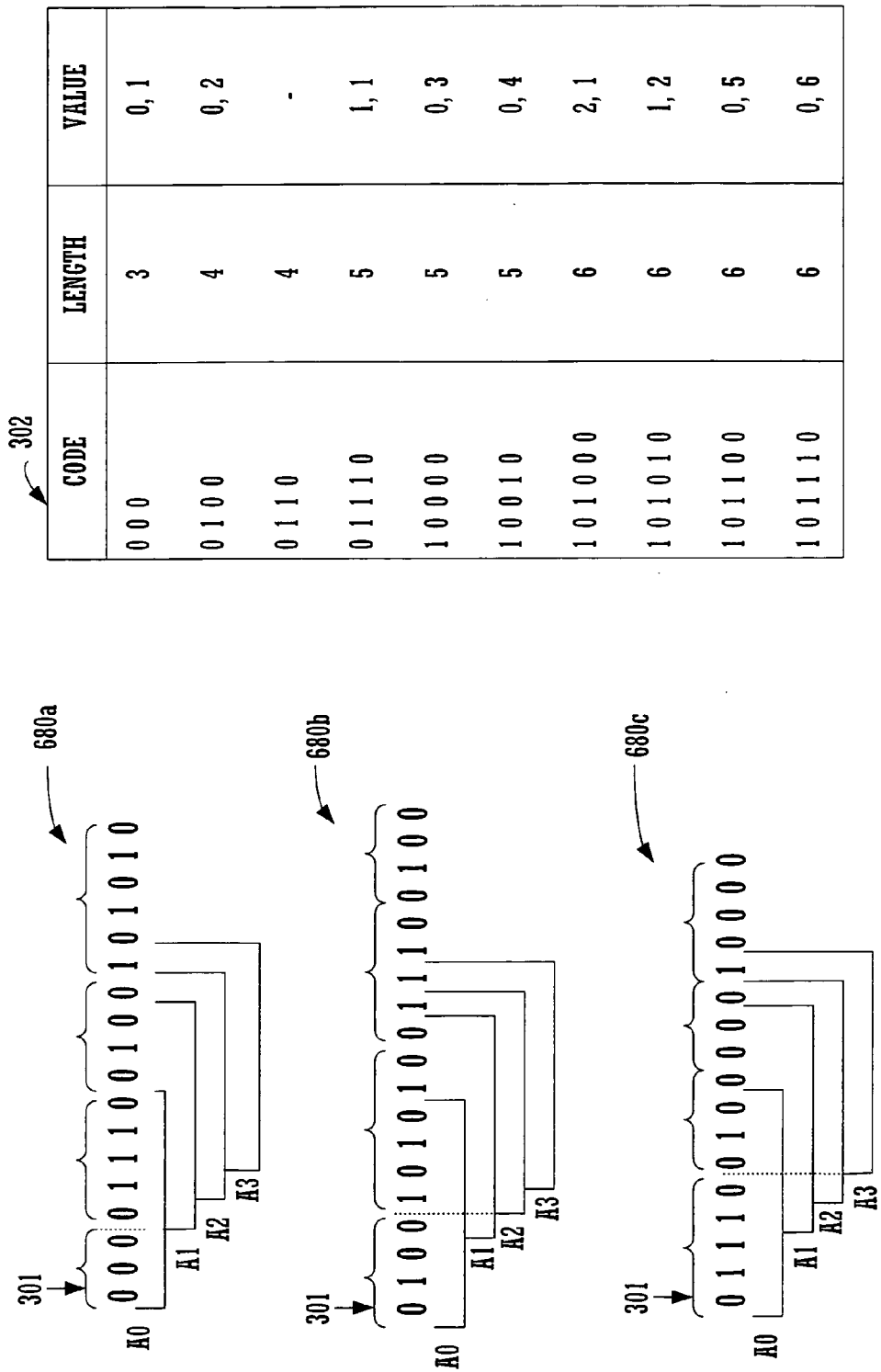
FIG. 6B is a diagram illustrating exemplary bit streams and an exemplary look-up table used for predictive table look-up of variable length codes, according to an embodiment of the present invention.

An embodiment of the present invention can be described by a more specific example, which is illustrated in FIGS. 6A and 6B. FIG. 6A illustrates a flowchart 600 of an example which processes four bit sections in parallel with each section being 8 bits long. FIG. 6B illustrates an exemplary bit stream 680, along with three portions of the bit-stream 680a–680c. These portions relate to the bit stream 680 as the present invention advances its reads further into the bit stream 680. As is clear from comparing bitstreams 680a, 680b, and 680c, the reference bit 301 is advanced into the bitstream by a offset based upon the look-up result, as is described herein.

In step 610 of FIG. 6A, four separate reads of the bit stream 680 are performed in parallel. Referring to FIG. 6B, these read operations correspond to bit stream 680*a*, which has its reference bit 301 on the left. The first 8 bits from the bit stream 680*a* get loaded into register $A_0$. In this example, the read to register $A_1$ is offset 3 bits from the read to register $A_0$. This is because the minimum symbol length is 3 bits. If the minimum symbol length were otherwise, the offset would be equal to that minimum symbol length. Data is read into register $A_2$ by an offset of 1 more bit, and register $A_3$ by an offset of still one more bit. This is because the lengths of the next smallest symbols, in this example, are four and five bits. The present invention is well suited to using offsets in this step of other than 1 bit, depending on the length of symbols in the table of variable length codes, as will be understood by those of ordinary skill in the art.

Referring now to FIG. 6A, in step 620 the variable length code table 302 is indexed with the values in each register, and the result in saved. In step 630, the look-up result is accepted or rejected according to a formula provided for this example. It will be understood by those in the art that the formula is exemplary and will be different if, for example, the minimum symbol length is different. The four formulas listed in boxes 632–638 in step 630 of FIG. 6A can be best understood by referring to the bit streams in FIG. 6B.

First Symbol is the Minimum Symbol Length

Box 632, in FIG. 6A refers to the case in which the symbol length is 3 bits, which in this case the minimum length. Box 632 states that the look-up result of registers $A_0$ and $A_1$ are valid. Referring now to FIG. 6B, bit stream 680*a* reflects this case. As is seen, $A_0$ and $A_1$ begin in the same location as a symbol in the bit stream and hence will index to a correct value in table 302.

First Symbol Length is 1 Bit Longer Than the Minimum Length

Box 634 in FIG. 6A refers to the case when the first symbol length is one bit larger than the minimum possible code length. In the example given, the symbol is four bits long, and the look-up result of registers $A_0$ and $A_2$ are valid. Referring to FIG. 6B, it is clear why this is so. Bit-stream 680*b* covers this case and clearly shows that $A_0$ and $A_2$ are loaded from positions of the bit stream in which a symbol starts. The section loaded into register $A_1$ contains part of the first symbol; however, and will produce in an invalid result. Embodiments of the present invention account for this and discard the look-up result for this register, as well as the look-up result for register $A_3$.

First Symbol Length is 2 Bits Longer Than the Minimum Symbol Length

Box 636 refers to the case in which the first symbol in the bit stream 680 is 5 bits long, or two bits longer than the minimum symbol length. In this case, the look-up result from registers $A_0$ and $A_3$ are valid. Referring to bit-stream 680*c* of FIG. 6B it is clear why this is so. In this case, the bits loaded into registers $A_0$ and $A_3$ each correspond to the start of a symbol in the bit-stream 680*c* and hence the look-up result is valid.

Box 638 of FIG. 6A refers to the case in which the symbol length of the bits loaded into the first register is greater than 5 bits. In this case, only the look-up result from the first register is accepted. However, because the most common values are encoded with short symbols, a relatively high percentage of symbols are short ones. Hence, the present invention decodes multiple symbols per iteration a relatively high percent of the time. Furthermore, longer symbols do not present as much of a problem with performance as short one do. This is because the significant measure of performance is how many bits can be decoded per unit time. Other embodiments of the present invention provide for cases with longer symbol lengths. The embodiment of the present invention disclosed in this example provides for a worst-case performance of 6 bits per loop.

In step 640, a check is made to see if the end of the buffer has been reached. The description of the video segment in "The Specification of Consumer Use Digital Video VCR's using 6.3 mm Magnetic Tape" (HD Digital VCR Conference, December, 1994) may be referred to for how to determine if the end of a block has been reached. In step 650, the bit stream is advanced by the sum of the accepted symbol lengths, and the process is repeated in step 610.

Figure 7:
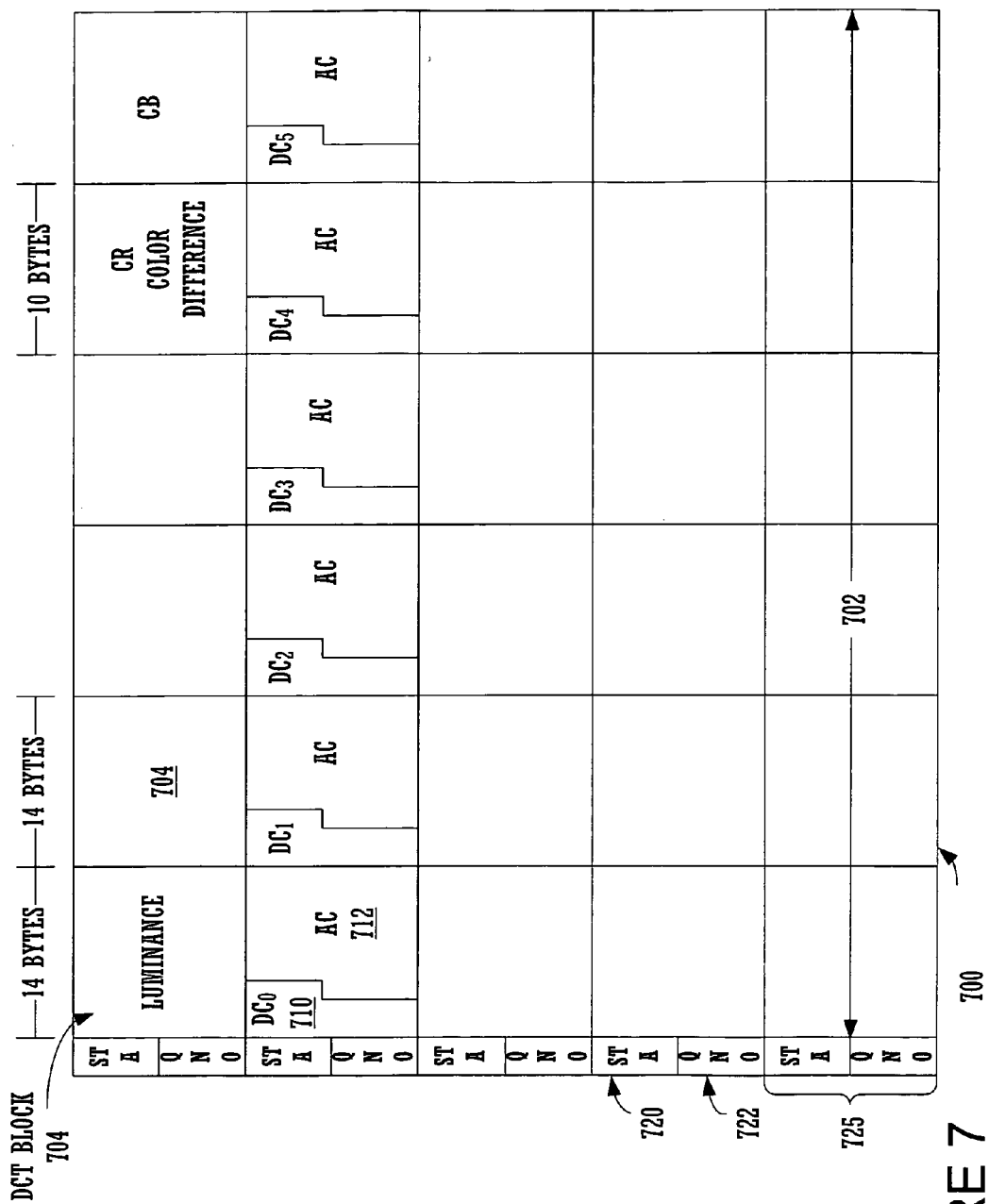
FIG. 7 is an illustration of a compressed block of a DV bitstream, which is an input to an embodiment of the present invention.

FIG. 7 illustrates a video segment 700 of a DV bitstream and is composed of five macro-blocks 702 of compressed information (rows in FIG. 7). In one embodiment of the present invention, the video segment 700 (DV bitstream) is an input to the VLD 200. Each video segment 700 is made up of five macro-blocks 702. In turn, each macro-block 702 is made up of a macroblock header 725 and six Discrete Cosine Transform (DCT) blocks 704. The macroblock header 725 is comprised of a fixed four bit value called the macroblock status (STA) 720 and a fixed four bit value called a Quantization number (QNO) 722.

Still referring to FIG. 7, the first four DCT blocks 704 contain luminance information and are 14 bytes long. The two right-most DCT blocks 704 contain color difference information and are each 10 bytes long. Each DCT block 704 has a DCI 710 (shown as $DC_0$–$DC_5$) which is comprised of: 1) a DC value of nine bits; 2) a motion bit of one bit; and 3) a class number of two bits. After the DCI 710 in the DCT block 704, the AC coefficients 712 are encoded with variable lengths. For example, a Huffman code may be used. Additional processing may be done to the data, such as shuffling and quantization. The present invention is well-suited to operate on data stored with any variable length code.

Because a variable length code is used, only the location of the first symbol in each DCT block 704 is known. The location of the later symbols in each block can only be determined after all the prior symbols in the DCT block 704 have been decoded to determine their lengths. However, the starting location of each DCT block 704 is known when using a DV bitstream 700, such as shown in FIG. 7. One embodiment of the present invention takes advantage of the abilities of single instruction multiple data (SIMD) instruction set to speed up the decoding process by decoding multiple DCT blocks 704 in parallel.

Figure 8:
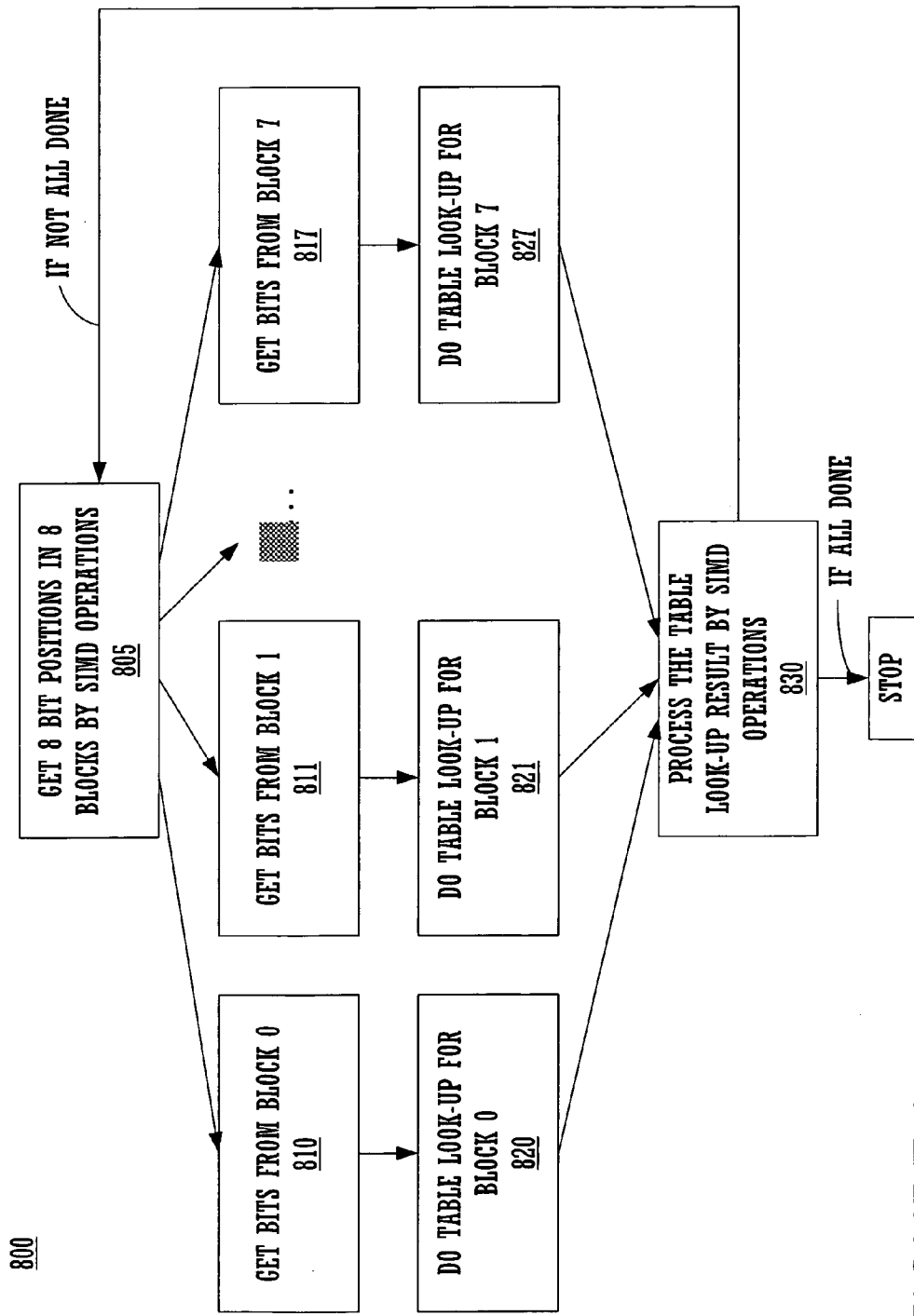
FIG. 8 is a flowchart of the steps of the process of decoding a video signal by decoding multiple blocks in parallel on VLIW architecture, using SIMD type instruction set is described, according to an embodiment of the present invention.

Referring to FIG. 8, the steps of the process 800 of decoding a video signal by decoding multiple blocks in parallel on VLIW architecture, using SIMD type instruction set is described. In one embodiment of the present invention, the video signal is in the form of the DV bitstream of FIG. 7. The example given operates on 8 bit sections; however, the present invention is well-suited to operate on sections of any size. Furthermore, the example operates on 8 sections at a time. As the architecture permits and as is needed to achieve real time digital video processing, the present invention is well-suited to operate on any number of sections at a time.

In step 805, the starting location of the bit stream in each DCT block 704 is determined by a single SIMD instruction. Next, steps 810–817 are performed with SIMD instructions. In these steps, an 8 bit section is read from each of 8 separate DCT blocks 704. Next, in steps 820–827 each section is decoded separately. The results of the table look-up may now be processed by SIMD instructions in step 830. The process is repeated until the complete video segment 700 is decoded. On the second and subsequent iteration of the loop each DCT block 704 is read from a location which is advanced by exactly the length of the symbol just decoded for that DCT block 704.

In this example a single symbol from each DCT block 704 is decoded each iteration. Another embodiment of the present invention combines the algorithm illustrated in FIG. 8 and described herein with the embodiment illustrated in FIGS. 5–6B and described herein. In this fashion, multiple symbols from each DCT block 704 are decoded in each iteration according to the embodiment of FIGS. 5–6B, and multiple DCT blocks 704 are being processed in parallel according to the embodiment in FIG. 8. Thus, even greater efficiency is achieved in decoding the bit-stream.

In another embodiment of the present invention, multiple ALUs are used in parallel to decode separate groups of DCT blocks 704. The process in FIG. 8 may be run in separate ALUs. By running the process on enough ALUs plus SIMD operations on each ALU, an entire video segment 700 containing 30 DCT blocks 704 may be decoded in parallel. Thus, the present invention takes advantage of the multiple ALUs generally present in VLIW architecture.

The preferred embodiment of the present invention a method and system for decoding, in parallel, symbols of variable length in a digital video bit stream in real time, using Very Long Instruction Word (VLIW) architecture, is thus described. While the present invention has been described in particular embodiments, it should be appreciated that the present invention should not be construed as limited by such embodiments, but rather construed according to the below claims.

What is claimed is:

1. A method of processing a signal comprising:
   a) reading a first bit section from a bit stream of variable length codes beginning at a reference bit of said bit stream, wherein said reading a first bit section is performed in a given direction;
   b) reading a second bit section from said bit stream beginning at a first offset from said reference bit of said bit stream, wherein said reading a second bit section is performed in said given direction, wherein steps a) and b) are done in parallel, and wherein said first offset is less than a minimum symbol length;
   c) indexing a table with said first bit section to obtain a first look-up result, said table comprising a plurality of variable length codes and a corresponding plurality of code lengths, said first look-up result describing the length of a first symbol in said bit stream;
   d) indexing said table with said second bit section to obtain a second look-up result, wherein steps c) and d) are done in parallel;
   e) determining if said second look-up result from step d) is valid; and
   f) accepting said second look-up result if it is valid, wherein said second look-up result describes a second symbol length in said bit stream.

2. The method of claim 1 further comprising:
   g) advancing the reference bit of said bit stream by the sum of said first and second symbol lengths; and
   h) repeating steps a) through f).

3. The method of claim 1 further comprising:
   g) reading a third bit section from said bit stream beginning at a second offset from said reference bit of said bit stream, wherein step a), step b), and step g) are done in parallel;
   h) indexing said table with said third bit section to obtain a third look-up result, wherein step c), step d), and step h) are done in parallel; and
   i) determining whether said third look-up result from step h) is valid.

4. The method of claim 3 wherein said second offset is one bit greater than said first offset.

5. The method of claim 1, wherein said first offset is equal to the minimum code length of codes in said table.

6. The method of claim 1 wherein said bit stream comprises digital video data.

7. The method of claim 1 wherein said bit stream comprises data in MPEG format.

8. The method of claim 1 wherein said bit stream comprises data encoded with Huffman coding.

9. A system for processing a signal comprising:
   means for reading a first bit section from a bit stream of variable length codes beginning at a reference bit of said bit stream, wherein said reading a first bit section is performed in a given direction;
   means for reading a second bit section from said bit stream beginning at a first offset from said reference bit of said bit stream, wherein said reading a second bit section is performed in said given direction, wherein said reading said first bit section and said reading said second bit section are done in parallel, and wherein said first offset is less than a minimum symbol length;
   means for indexing a table with said first bit section to obtain a first look-up result, said table comprising a plurality of variable length codes and a corresponding plurality of code lengths, said first look-up result describing the length of a first symbol in said bit stream;
   means for indexing said table with said second bit section to obtain a second look-up result, wherein said indexing a table with said first bit section and said indexing a table with said second bit section are done in parallel;
   means for determining if said second look-up result is valid; and
   means for accepting said second look-up result if it is valid, wherein said second look-up result describes a second symbol length in said bit stream.

10. The system of claim 9 further comprising:
    means for advancing the reference bit of said bit stream by the sum of said first and second symbol lengths.

11. The system of claim 9 further comprising:
    means for reading a third bit section from said bit stream beginning at a second offset from said reference bit of said bit stream, wherein said reading a third bit section is done in parallel with said reading said first bit section and said reading said second bit section;
    means for indexing said table with said third bit section to obtain a third look-up result, wherein said indexing a table with said third bit section is done in parallel with said indexing a table with said first bit section and said indexing a table with said second bit section; and
    means for determining whether said third look-up result is valid.

12. The system of claim 11 wherein said second offset is one bit greater than said first offset.

13. The system of claim 9, wherein said first offset is equal to the minimum code length of codes in said table.

14. The system of claim 9 wherein said bit stream comprises digital video data.

15. The system of claim 9 wherein said bit stream comprises data in MPEG format.

16. The system of claim 9 wherein said bit stream comprises data encoded with Huffman coding.

* * * * *

UNITED STATES PATENT AND TRADEMARK OFFICE
CERTIFICATE OF CORRECTION

PATENT NO. : 7,142,603 B2 Page 1 of 1
APPLICATION NO. : 09/933599
DATED : November 28, 2006
INVENTOR(S) : Amelia C. Luna and Jason N. Wang It is certified that error appears in the above-identified patent and that said Letters Patent is hereby corrected as shown below:

Insert on Title Page, after Item (22)
(63) Related US Application Data

This is a continuation of United States Patent Application Number 09/602,578, filed on June 22, 2000 Which is hereby incorporated by reference.

Signed and Sealed this

Eighteenth Day of March, 2008

JON W. DUDAS
*Director of the United States Patent and Trademark Office*